(12) United States Patent
Fricker

(10) Patent No.: US 10,923,412 B2
(45) Date of Patent: Feb. 16, 2021

(54) APPARATUSES AND METHODS FOR IMPLEMENTING A SLIDING THERMAL INTERFACE BETWEEN SUBSTRATES WITH VARYING COEFFICIENTS OF THERMAL EXPANSION

(71) Applicant: Cerebras Systems Inc., Los Altos, CA (US)

(72) Inventor: Jean-Philippe Fricker, Los Altos, CA (US)

(73) Assignee: Cerebras Systems Inc., Los Altos, CA (US)

( * ) Notice: Subject to any disclaimer, the term of this patent is extended or adjusted under 35 U.S.C. 154(b) by 0 days.

(21) Appl. No.: 16/537,933

(22) Filed: Aug. 12, 2019

(65) Prior Publication Data

US 2020/0051890 A1    Feb. 13, 2020

Related U.S. Application Data

(60) Provisional application No. 62/717,244, filed on Aug. 10, 2018.

(51) Int. Cl.
*H01L 23/373* (2006.01)
*H01L 21/48* (2006.01)

(52) U.S. Cl.
CPC ...... *H01L 23/3735* (2013.01); *H01L 21/4871* (2013.01); *H01L 23/3732* (2013.01); *H01L 23/3737* (2013.01)

(58) Field of Classification Search
CPC ............. H01L 23/3735; H01L 23/3732; H01L 21/4871; H01L 23/3737; H01L 2924/15192; H01L 2224/16225; H01L 23/373–3738; C09K 5/14
USPC ........................................................ 257/705
See application file for complete search history.

(56) References Cited

U.S. PATENT DOCUMENTS

| | | | | |
|---|---|---|---|---|
| 6,206,997 | B1 * | 3/2001 | Egitto | B29C 59/14 156/242 |
| 8,383,459 | B2 * | 2/2013 | Supriya | H01L 23/3735 438/118 |
| 8,440,312 | B2 * | 5/2013 | Elahee | C08L 83/04 428/447 |
| 9,795,059 | B2 * | 10/2017 | Strader | H05K 7/2039 |
| 10,068,830 | B2 * | 9/2018 | Zeng | H01L 23/3737 |
| 2001/0004546 | A1 * | 6/2001 | Tobita | H01L 21/4871 438/519 |
| 2003/0189246 | A1 * | 10/2003 | Iwaki | H01L 25/162 257/706 |

(Continued)

*Primary Examiner* — Mohammad M Hoque
(74) *Attorney, Agent, or Firm* — Jeffrey Schox

(57) ABSTRACT

Systems and methods include an integrated circuit assembly that includes a semiconductor substrate; a heat transfer element; and an ambulatory thermal interface arranged between the semiconductor substrate and the heat transfer element, the ambulatory thermal interface comprising: a thermally conductive material, and a friction reduction material, wherein: the thermally conductive material is arranged along a surface of the heat transfer element, the friction reduction material is arranged along a surface of the semiconductor substrate, opposing surfaces of the thermally conductive material and the friction reduction material define a slidable interface when placed in contact.

18 Claims, 15 Drawing Sheets

(56) References Cited

U.S. PATENT DOCUMENTS

| | | | | |
|---|---|---|---|---|
| 2004/0125564 | A1* | 7/2004 | DiStefano | H01L 21/563 361/704 |
| 2005/0256241 | A1* | 11/2005 | Sachdev | H01L 23/433 524/439 |
| 2005/0274487 | A1* | 12/2005 | Goth | F28D 15/02 165/80.2 |
| 2009/0108437 | A1* | 4/2009 | Raymond | H01L 23/3735 257/713 |
| 2010/0122807 | A1* | 5/2010 | Harttig | F25B 21/04 165/185 |
| 2014/0374897 | A1* | 12/2014 | Zhao | H05K 1/0203 257/713 |
| 2016/0021788 | A1* | 1/2016 | Chauhan | B23P 15/26 361/706 |
| 2016/0150680 | A1* | 5/2016 | Aramaki | H01L 23/3737 165/133 |
| 2016/0276307 | A1* | 9/2016 | Lin | H01L 23/552 |
| 2017/0125321 | A1* | 5/2017 | Manninen | H01L 23/3737 |
| 2019/0132994 | A1* | 5/2019 | Johnson | H01R 13/6581 |
| 2019/0267306 | A1* | 8/2019 | Raravikar | H01L 25/0655 |
| 2019/0371700 | A1* | 12/2019 | Yeh | H01L 23/42 |

* cited by examiner

Providing a Semiconductor Substrate S210

Identifying a Largest Square S215

Fabricating Circuitry Layers S220

Providing Self-Correcting Mechanisms S222

Providing a Protective Barrier S225

Fabricating Inter-Die Connections S230

Semiconductor Substrate Reduction S240

Applying a 1st Thermal Interface Component S810

Adding a Mating Layer S815

Applying a 2nd Thermal Interface Component S820

Defining a Sliding Thermal Interface S830

Enhancing the Sliding Thermal Interface S835

APPARATUSES AND METHODS FOR IMPLEMENTING A SLIDING THERMAL INTERFACE BETWEEN SUBSTRATES WITH VARYING COEFFICIENTS OF THERMAL EXPANSION

CROSS-REFERENCE TO RELATED APPLICATIONS

This application claims the benefit of U.S. Provisional Application No. 62/717,244, filed 10 Aug. 2018, which is incorporated in its entirety by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

SUMMARY OF THE INVENTION(S)

In one embodiment, an integrated circuit assembly includes a semiconductor substrate; a heat transfer element; and an ambulatory thermal interface arranged between the semiconductor substrate and the heat transfer element, the ambulatory thermal interface comprising: a thermally conductive material, and a friction reduction material, wherein: the thermally conductive material is arranged along a surface of the heat transfer element, the friction reduction material is arranged along a surface of the semiconductor substrate, opposing surfaces of the thermally conductive material and the friction reduction material define a slidable interface when placed in contact.

In one embodiment, a first surface of the thermally conductive material is mated with the surface of the heat transfer element, a first surface of the friction reduction material is mated with the surface of the semiconductor substrate, a second surface of the thermally conductive material that is opposite the first surface of the thermally conductive material defines a free surface of the thermally conductive material, a second surface of the friction reduction material that is opposite the first surface of the friction reduction element defines a free surface of the friction reduction element, and the free surface of the thermally conductive material and the free surface of the friction reduction element define the slidable interface.

In one embodiment, the thermally conductive material comprises an indium-based material, and the friction reduction material comprises a polytetrafluoroethylene-based material.

In one embodiment, a shear strength of the thermally conductive material is equal to or above a shear strength of the heat transfer element and below a maximum shear strength threshold.

In one embodiment, the integrated circuit assembly includes a mating layer that is interposed between the thermally conductive material and the surface of the heat transfer element, wherein the mating layer comprising a material distinct from the thermally conductive material.

In one embodiment, the friction reduction material comprises polytetrafluoroethylene having a thickness that is three hundred nanometers or less.

In one embodiment, a thermal conductivity (k) value of the thermally conductive material is greater than a thermal conductivity value of an air gap.

In one embodiment, a coating of the friction reduction material is disposed continuously along the surface of the semiconductor substrate.

In one embodiment, a coating of the friction reduction material is disposed discontinuously along the surface of the semiconductor substrate thereby forming gaps between deposits of the coating.

In one embodiment, the friction reduction material includes a material having a lower coefficient of friction value than an opposing surface of the thermally conductive material.

In one embodiment, the friction reduction material comprises one of aluminum magnesium boride and diamond-like carbon.

In one embodiment, the thermally conductive material comprises one of thermal grease, thermal adhesives, thermal gap fillers, thermally conductive pads or sheets, and thermal tape.

In one embodiment, an integrated circuit assembly includes a semiconductor substrate; a heat transfer element; and an ambulatory thermal interface arranged between the semiconductor substrate and the heat transfer element, the ambulatory thermal interface includes a thermally conductive material, and a friction reduction material, wherein: the thermally conductive material is arranged along a surface of the semiconductor substrate, the friction reduction material is arranged along a surface of the heat transfer element, opposing surfaces of the thermally conductive material and the friction reduction material define a slidable interface when placed in contact.

In one embodiment, a first surface of the thermally conductive material is mated with the surface of the semiconductor substrate, a first surface of the friction reduction material is mated with the surface of the heat transfer element, a second surface of the thermally conductive material that is opposite the first surface of the thermally conductive material defines a free surface of the thermally conductive material, a second surface of the friction reduction material that is opposite the first surface of the friction reduction element defines a free surface of the friction reduction element, and the free surface of the thermally conductive material and the free surface of the friction reduction element define the slidable interface.

In one embodiment, an integrated circuit assembly includes a heat source; a heat dissipater; a sliding thermal interface interposed between the heat source and the heat dissipater, the sliding thermal interface comprising: a thermally conductive material is arranged along a surface of the heat dissipater; a friction reduction material is arranged along a surface of the heat source; opposing surfaces of the thermally conductive material and the friction reduction material define a slippery interface that enables a relative movement between the thermal conductive material and the friction reduction material when in contact.

In one embodiment, the thermally conductive material and the friction reduction material slide at the slippery interface based on an expansion or a contraction of one or more of the heat source and the heat dissipater.

In one embodiment, the thermally conductive material comprises indium-based material, and the friction reduction material comprises a polytetrafluoroethylene-based material.

BRIEF DESCRIPTION OF THE FIGURES

FIG. 2 illustrates a method 200 in accordance with one or more embodiments of the present application;

DESCRIPTION OF THE PREFERRED EMBODIMENTS

Figure 1:
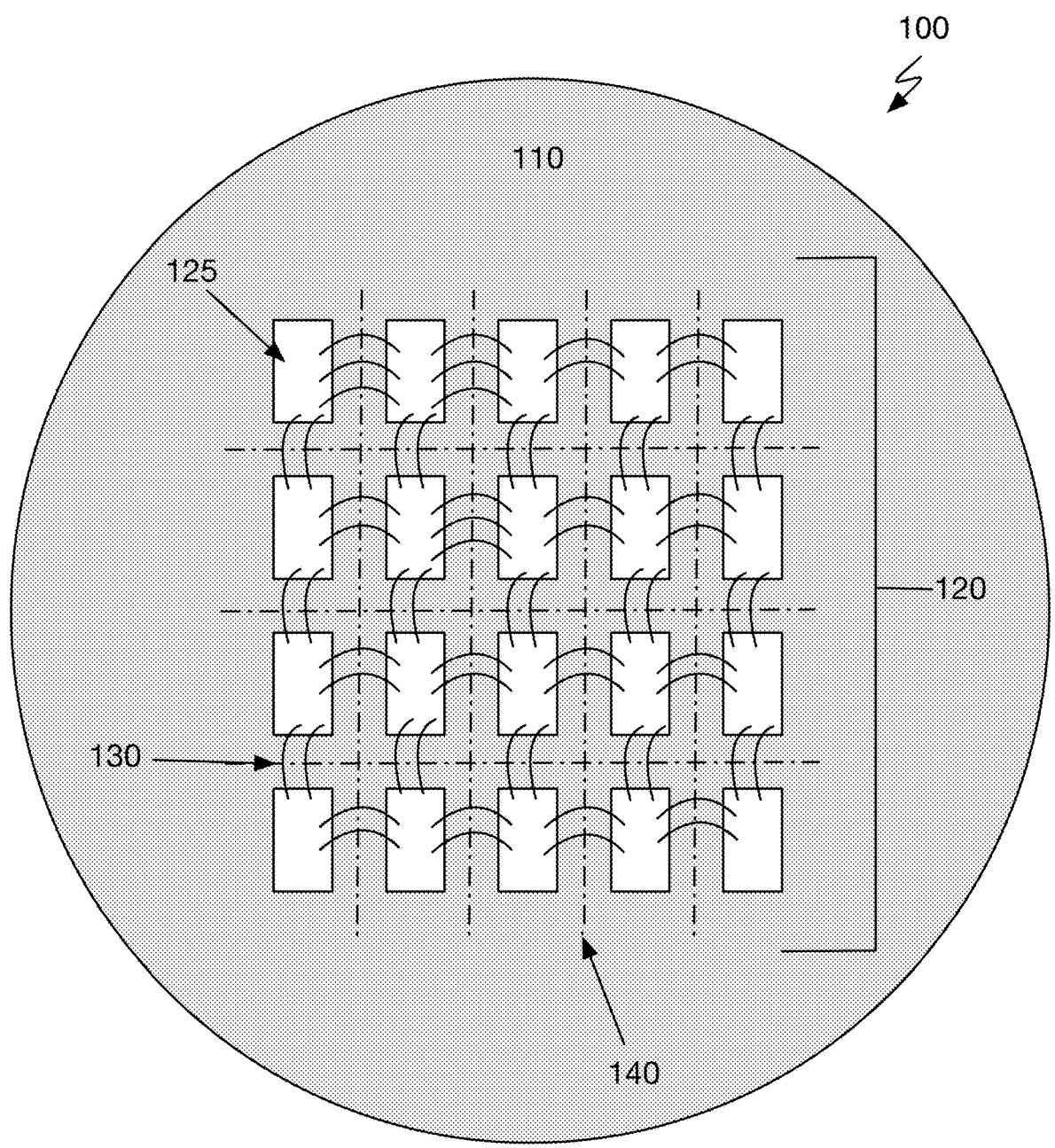
FIG. 1 illustrates a schematic of a system 100 in accordance with one or more embodiments of the present application.
Figure 3A:
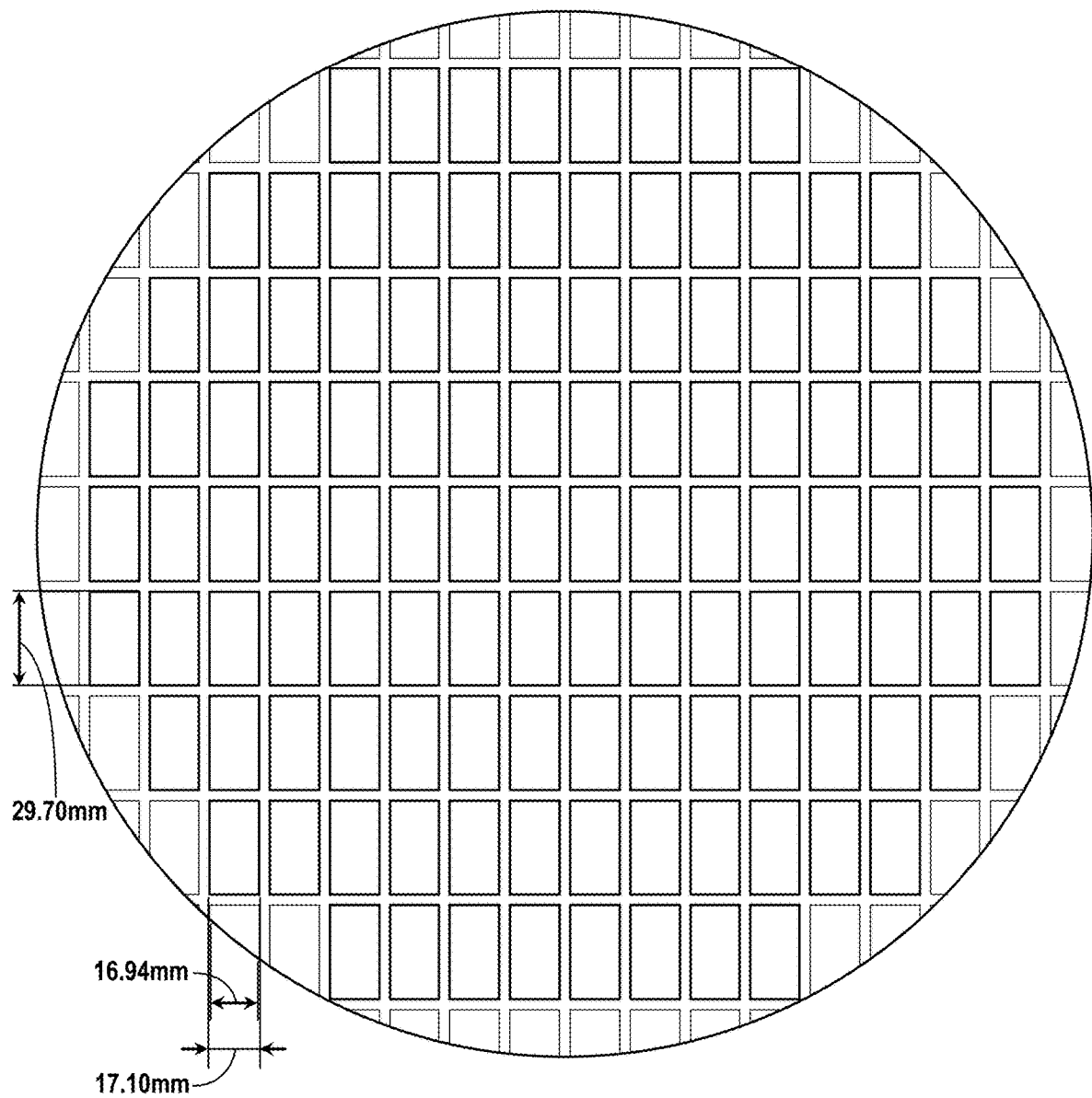
FIG. 3A-3D illustrate several schematics of a semiconductor substrate without and with interconnections in accordance with one or more embodiments of the present application.
Figure 3B:
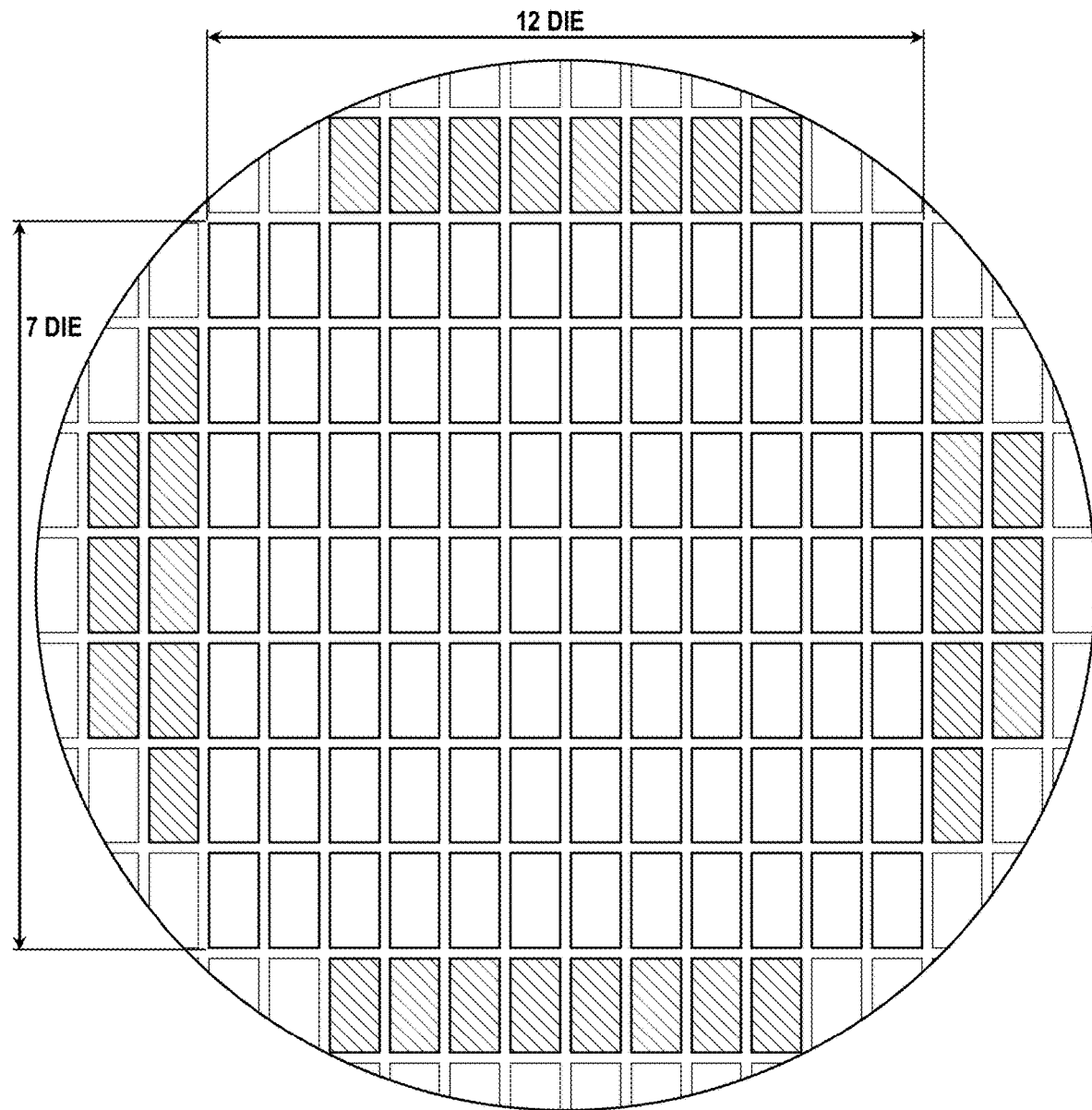
Figure 3C:
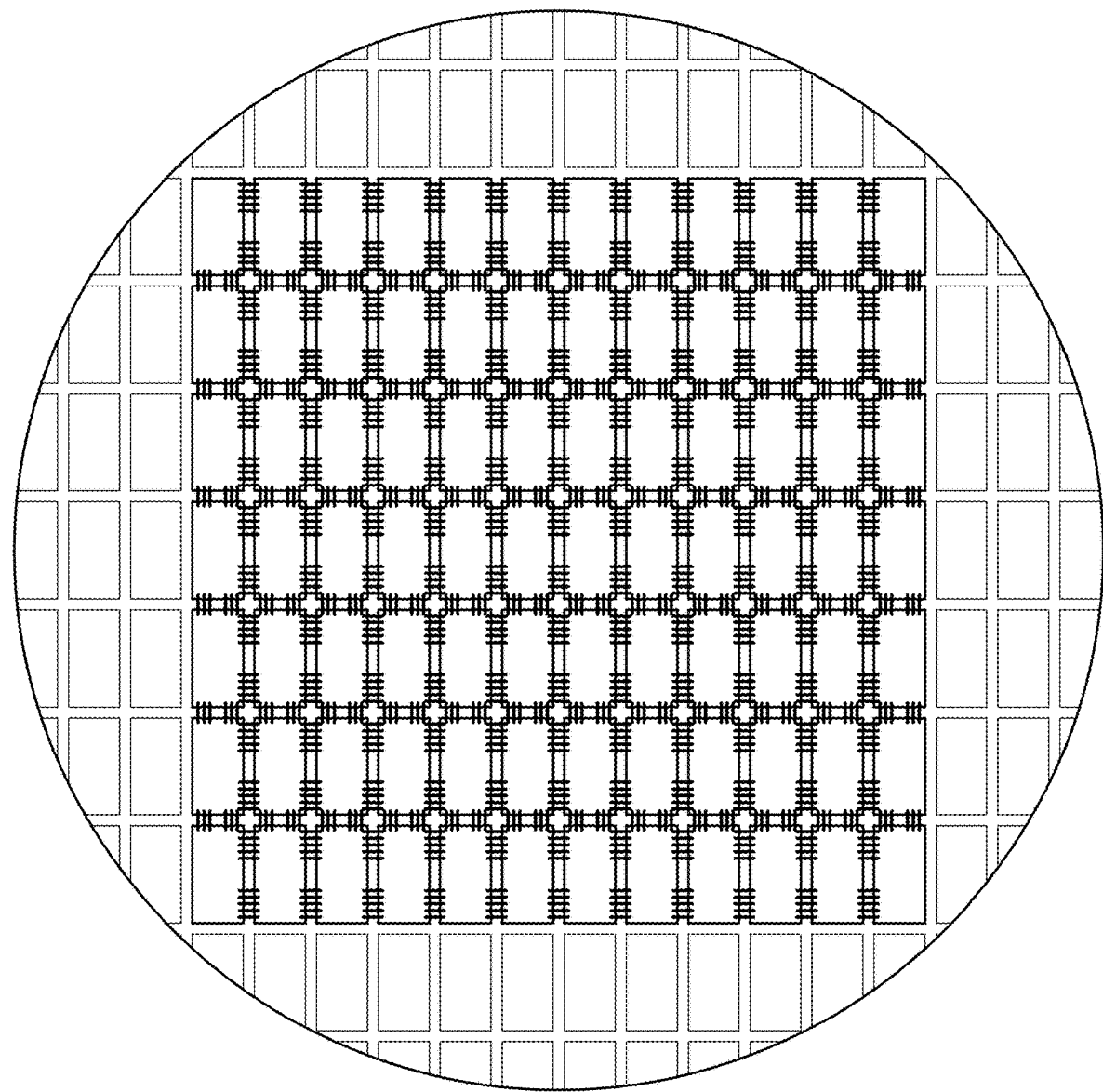
Figure 3D:
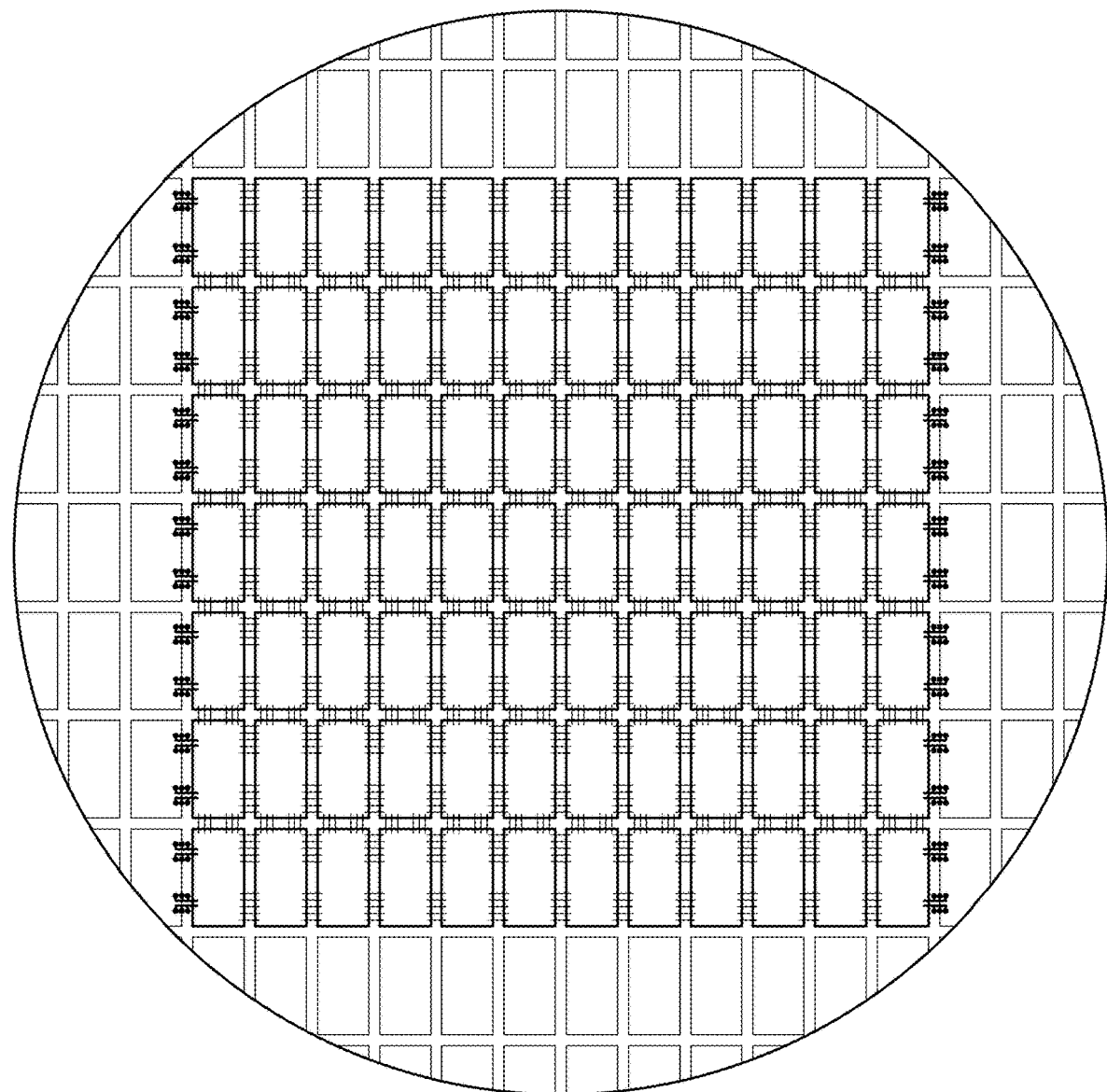
Figure 4A:
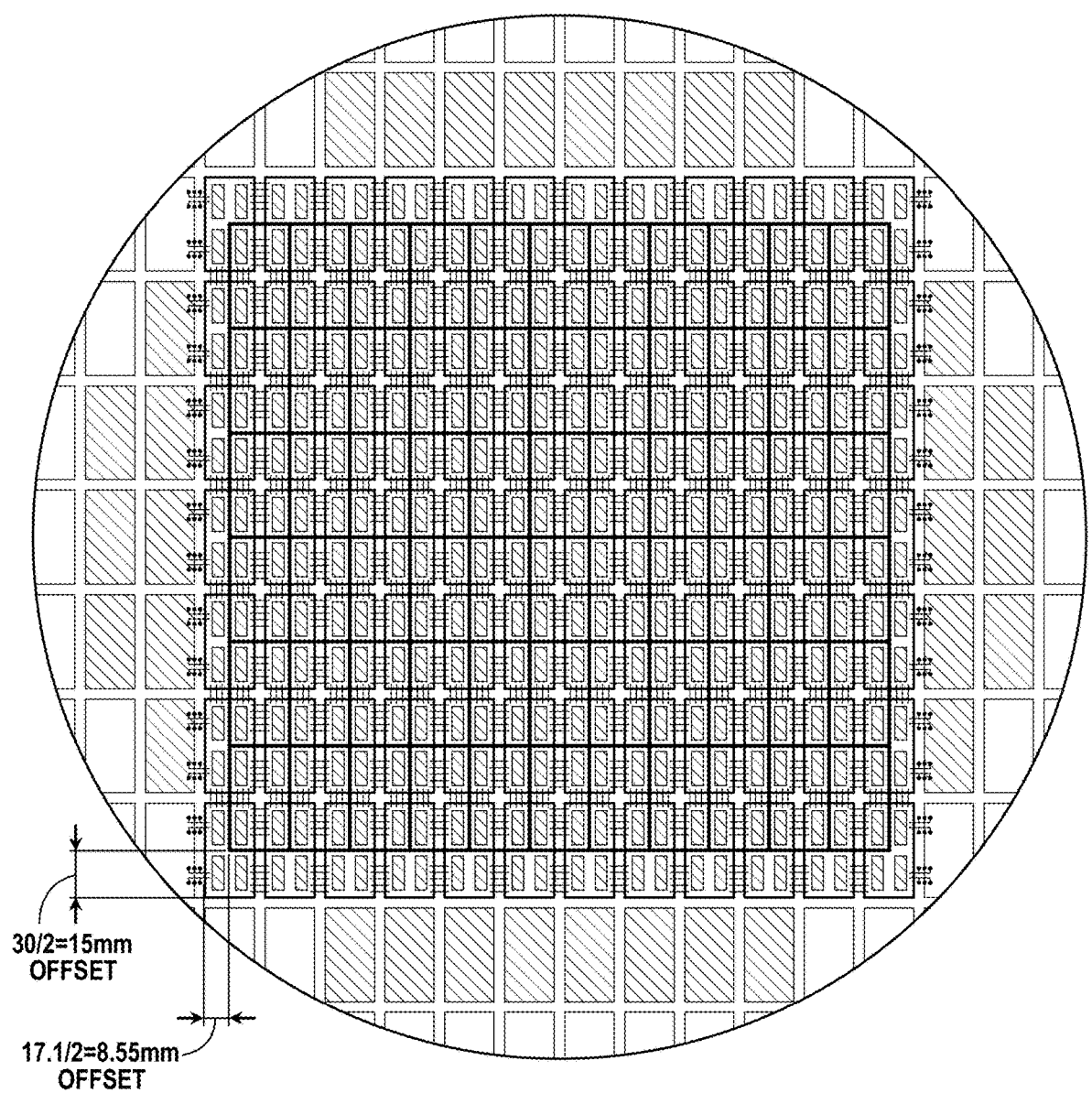
FIG. 4A-4D illustrate several schematics of a semiconductor substrate during exposure processes and size reduction in accordance with one or more embodiments of the present application.
Figure 4B:
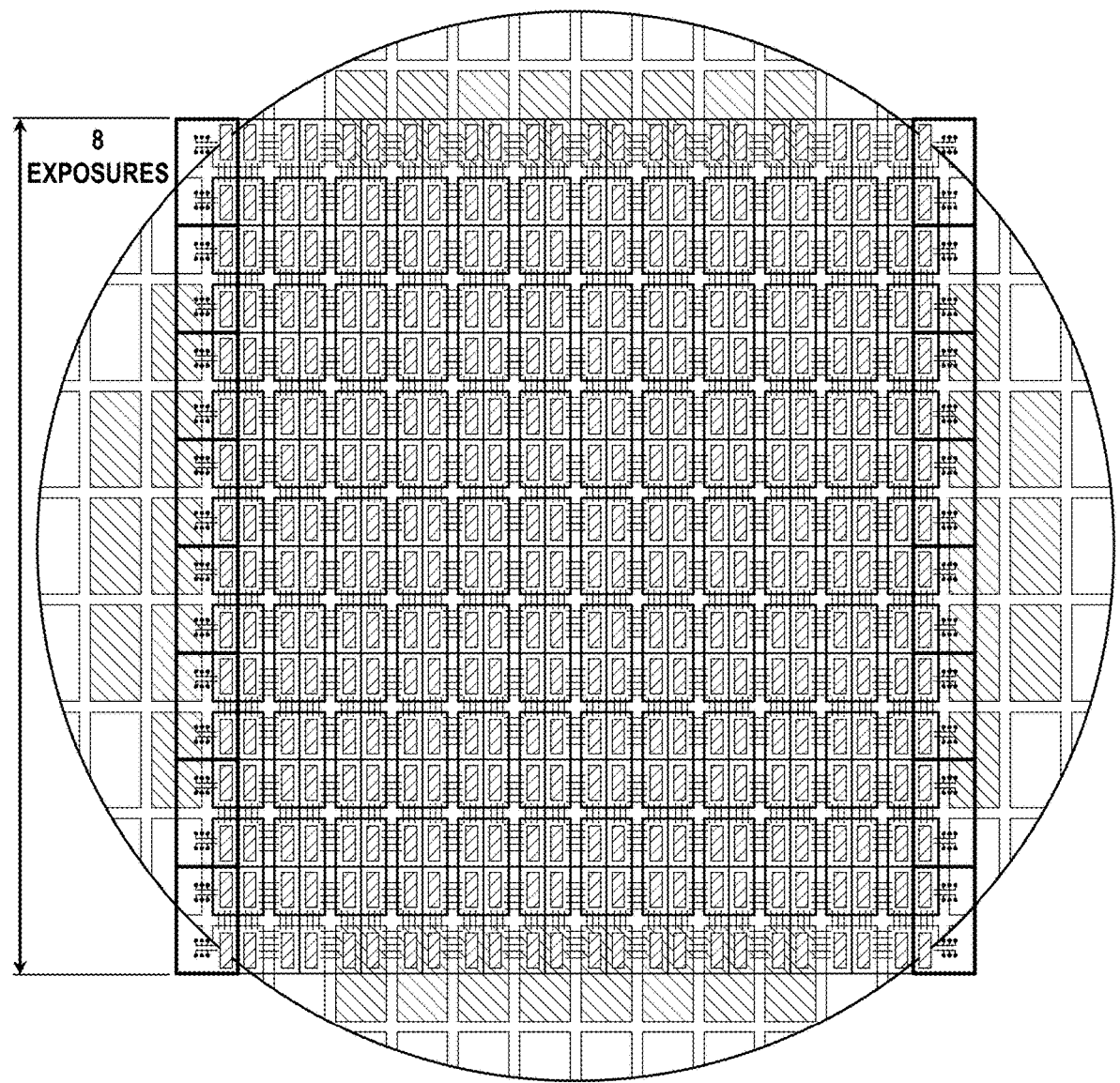
Figure 4C:
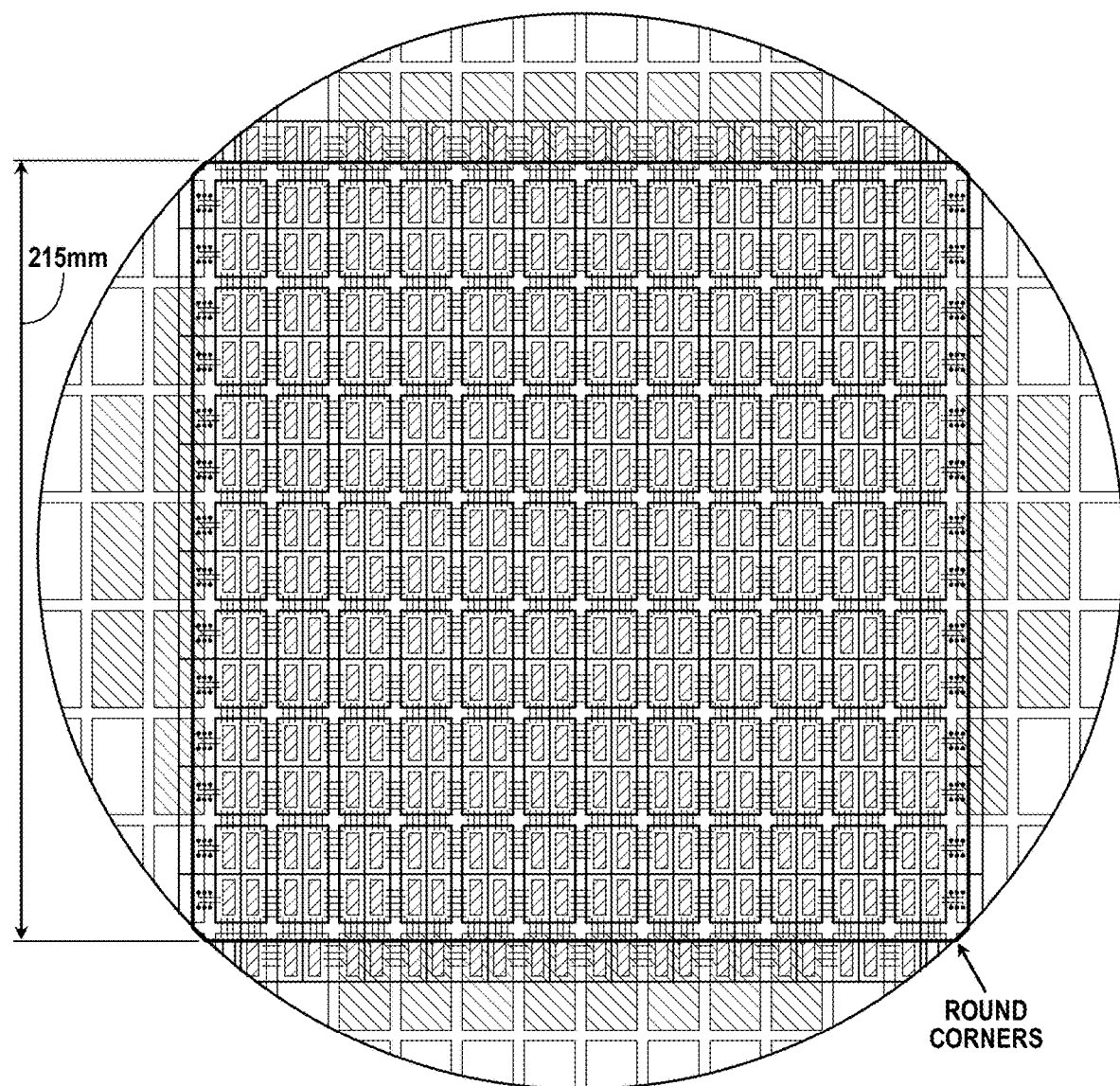
Figure 4D:
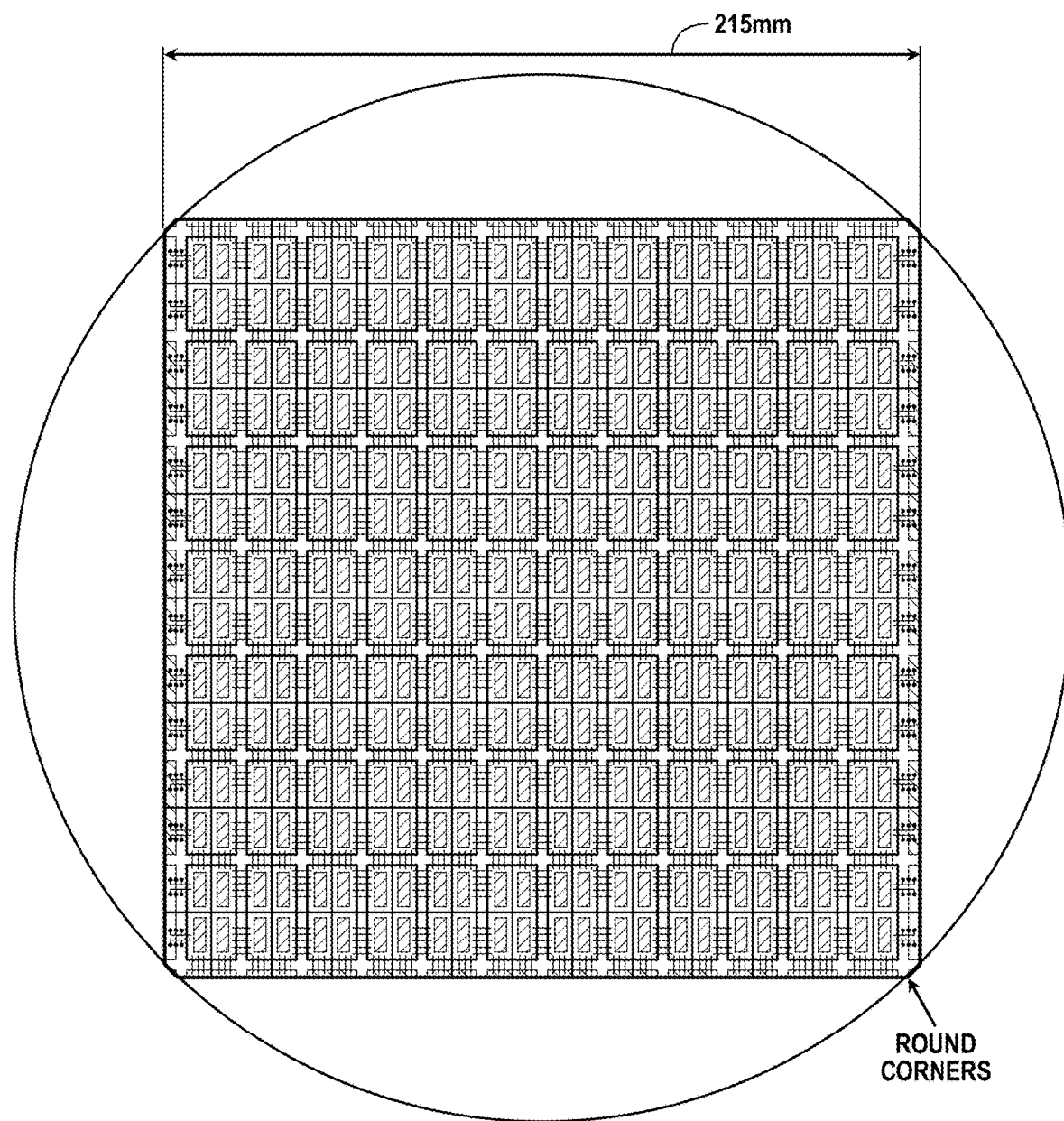

The following description of preferred embodiments of the present application are not intended to limit the inventions to these preferred embodiments, but rather to enable any person skilled in the art of to make and use these inventions.

1. Overview 1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. In general, a printed circuit board typically functions to mechanically support and electrically connect electronic components or electrical components using conductive tracks, pads, and other features etched from one or more sheet layers of metal (e.g., copper) laminated onto and/or between sheet layers of a non-conductive substrate. The (electrical or signal) communication connections between the chips may typically be found in the PCB. However, when a multi-chip PCB is manufactured in this manner, the communication between disparate chips thereon becomes limited by the amount connectivity or bandwidth available in a given connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, a number of technical problems relating to operational yield of the die on the large chip, packaging of the large chip, and powering/cooling of the large chip must also be solved.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved, the very large size of the resulting die then gives rise to many technical issues at the system level when packaging the very large die to a PCB or an organic substrate (or any suitable substrate).

The embodiments of the present application, therefore, also provide a system and method for enabling a large silicon die, similar to those described in section 1.1 and beyond, to package with non-compliant coefficient of thermal expansion (CTE) PCBs or organic substrates.

The technical problem of CTE mismatch arises in the computer chip packaging process is due to differences in the CTE of silicon onto which an integrated circuit is fabricated and the CTE of the PCB onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip. In traditional chip packaging, it is only a single silicon die with circuitry that is attached to a PCB at a time and the relatively small size of the single silicon die may produce a small expansion mismatch with the PCB that the single silicon die is attached to. For instance, to attach a single silicon die to a PCB, small microbumps are added to a surface of the single silicon die then the silicon die is affixed to the PCB. When the single silicon die and the PCB expand at different rates due to differences in CTE properties of the material, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no PCBs that may be selected to achieve CTE compatibility with the CTE of the large silicon die.

To address at least these technical problems, embodiments of the present application provide an elastomeric connector that is disposed between the large silicon die and a PCB or other organic substrate. The elastomeric connector may be capable of conducting a signal through it while placed under pressure and may also be malleable. The malleability of the elastomeric connector allows for absorption of the shearing displacement between the large silicon die and the PCB.

1.3 Slidable Thermal Interface Material

As alluded to in section 1.1 and 1.2, the integrated circuit architecture that enables inter-die connectivity between a plurality of die results in a very large integrated circuit (chip). Accordingly, as the integrated circuit becomes larger and/or dissipates a greater amount of power due to its size, a mismatch between a coefficient of thermal expansion (CTE) between the integrated circuit and a heatsink (heatspreader or the like) may be exacerbated and may cause incurable damage to a thermal interface material between the integrated circuit and the heat sink. Therefore, there is a need for thermal interface material that is compliant with mating surfaces of both the integrated circuit and a heatsink, as well as that enables at least one of the mating surfaces between the thermal interface material and integrated circuit and/or the thermal interface material and the heatsink to, preferably, slide and at a minimum, sheer against each other without damaging the thermal interface material beyond an incurable threshold.

As background, thermal interface material has been used to allow heat resulting from a dissipation of power from an integrated circuit to pass from the integrated circuit to a heatsink and to additionally, provide compliance in mating surfaces and potentially, shearing capabilities. Some standard thermal interface materials may be made of greases, gels, and/or other compliant semi-solid materials to enable the thermal interface material to conform to the surfaces of the integrated circuit and the heatsink. In some other cases, phase change materials may be used that allow the surfaces at the thermal interface between the integrated circuit and the heatsink to wet thereby providing a gap-free thermal conduction path to and through the thermal interface material.

Indium may be an example thermal interface material applied in modern integrated circuits, which has excellent thermal conduction and malleability properties that allows indium to conform to mating surfaces and provide some level of shearing capabilities. However, as a size of an integrated circuit increases, a shearing distance also increases, which can compromise the thermal interface material. It may be possible to increase the thickness of indium but then the thermal resistance is increased, accordingly, thereby reducing its suitably to carry or pass along heat.

To address at least these technical problems, embodiments of the present application provide a thermal interface that may be disposed between a heat source (e.g., a silicon semiconductor substrate) and a heatsink that enables thermal flow for cooling the heat source and a sliding thermal interface that allows movement between the heat source and the heatsink.

2. An IC with Inter-Die Connections and an Elastomeric Connector Assembly

2.1 IC with Inter-Die Connections

As shown in FIG. 1, a semiconductor 100 illustrates an example integrated circuit having a substrate 110, a plurality of die 120 formed with the substrate 110, a circuit layer 125, a plurality of inter-die connections 130, and scribe lines 140.

The semiconductor 100 may be manufactured using any suitable lithography system that is configured to implement the one or more steps of the methods described herein, including method 200.

The semiconductor 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasedly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate 110 and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first dice to a second dice located on the substrate 110. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate 110.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate 110. When positioned in an interior of the substrate 110, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate 110.

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Elastomeric Connector Assembly

Figure 5:
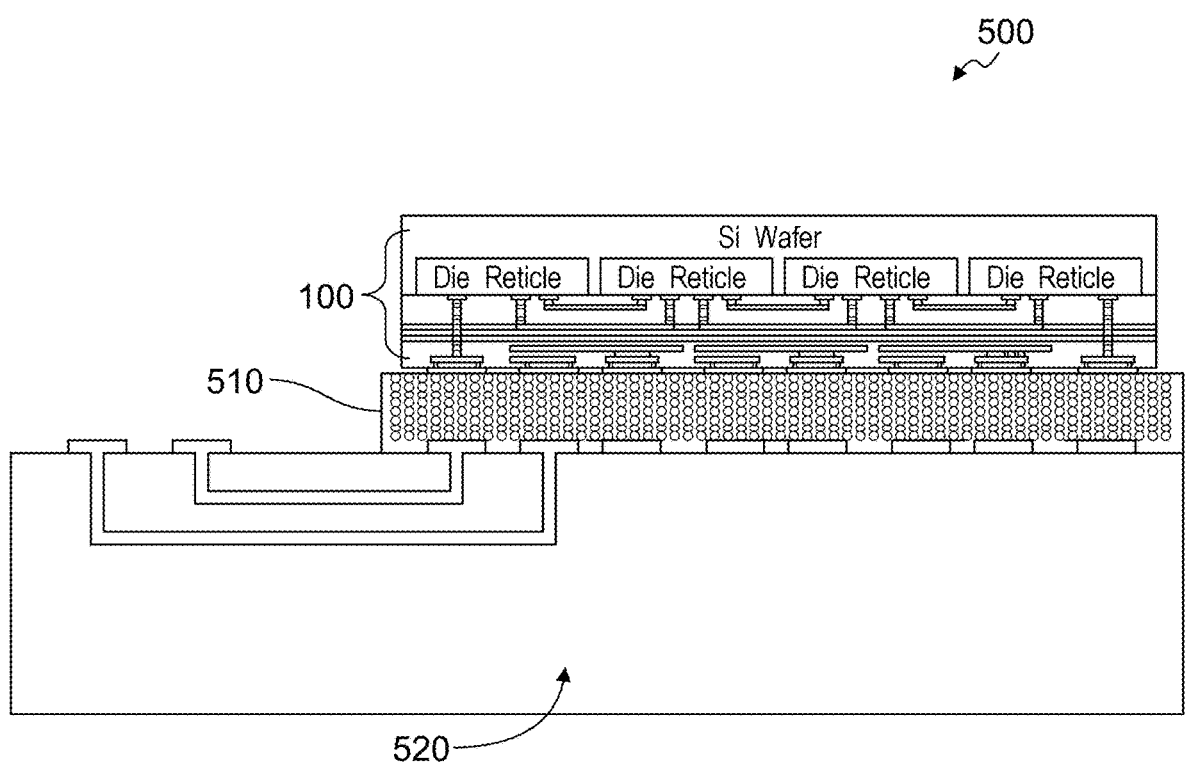
FIG. 5 illustrates a semiconductor assembly 500 in accordance with one or more embodiments of the present application.

As shown in FIG. 5, a schematic of a semiconductor assembly 500 includes an elastomeric connector 510 disposed between the semiconductor 100 and a circuit board 520.

The elastomeric connector 510 functions to secure the large semiconductor 100 to a circuit board 520. The elastomeric connector 510 preferably functions to place the semiconductor 100 and circuit board 520 in operable signal communication by conducting signals between them in a vertical direction (a direction normal to surfaces of both the semiconductor 100 and circuit board 520). Specifically, each of the semiconductor 100 and the circuit board 520 may include one or more conductive pads. The conductive pads of the semiconductor 100 may generally oppose the conductive pads of the circuit board 520 and may also, have a one-to-one alignment with each other. The elastomeric connector 510 is preferably designed to be interposed between the opposing surfaces of the conductive pads of both the semiconductor 100 and the circuit board 520. In this way, signals provided by a conductive pad of either the semiconductor 100 or the circuit board 520 may be transmitted through the elastomeric conductor 510 to an opposite conductive pad of the other of the semiconductor 100 and the circuit board 520.

Figure 6A:
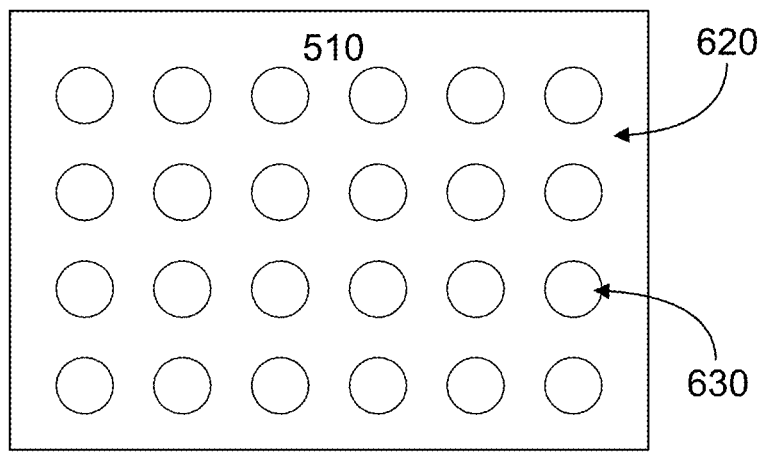
FIG. 6A-6B illustrate schematic examples of an elastomeric connector in accordance with one or more embodiments of the present application.

As shown in FIG. 6A, the elastomeric connector 510 includes a membrane 620 having a plurality of conductive elements 630. The membrane 620 may be any suitable material but is preferably made using silicon material.

Figure 6B:
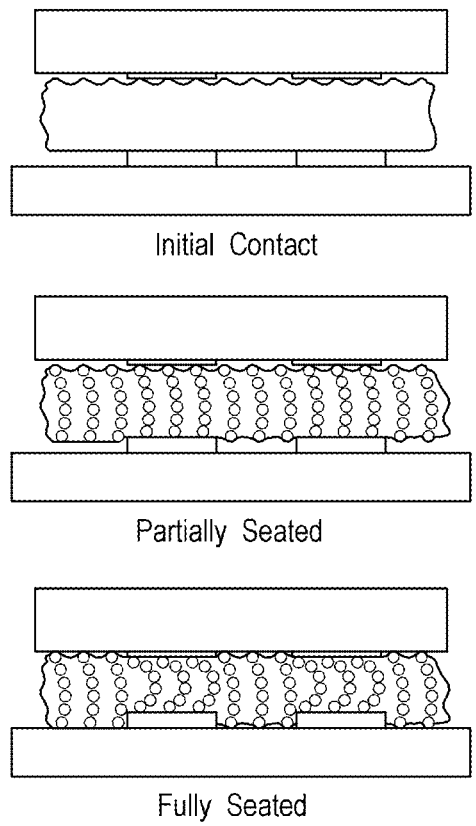

The plurality of conductive elements 630 may be any suitable conductive material that are arranged distributively and/or separately arranged within a body of the membrane 620. The plurality of conductive elements generally include a plurality of particles, such as ball wires, that when placed under compression (e.g., vertical compression) come into conductive contact with adjacent particles. That is, in a first state (of un-compression) in which the elastomeric connector 510 is not placed under a compressive load, the plurality of conductive elements 630 are preferably distributed within the body of the membrane 620 substantially (some contact) or fully independent (no contact) of each other. However, in a second state (of compression) in which the elastomeric connector 510 is placed under a compressive load, the plurality of conductive elements 630 preferably come into contact and may function to form multiple disparate conductive chains (conductive strings) or electrical paths from a first surface region of the elastomeric connector 510 to a second surface region (preferably opposing surface region) of the elastomeric connector 510 that function to electrically connect the conductive pads of the semiconductor 100 and the conductive pads at the circuit board 520. As shown in FIG. 6B, when under compression, the plurality of conductive elements 630 only make contact vertically and not horizontally. However, it shall be noted that if a laterally compressive force were applied to the elastomeric connector 510, the plurality of conductive elements 630 would similarly come into contact to form an electrical signal path between the opposing surface regions of the elastomeric connector 510.

The plurality of conductive elements 630 may, additionally, function to provide an elastic effect or spring effect in one or more portions of the elastomeric connector 510 to generally resist compressive forces, shearing forces, and/or permanent deformations in the elastomeric connector 510. Accordingly, when one or more portions of the elastomeric connector 510 is placed under a load, the plurality of conductive elements 630 may elastically compress without allowing the elastomeric connector 510 to undergo permanent deformation. That is, even after a large load (e.g., four tons of pressure or the like) the plurality of conductive elements 630 are sufficiently elastic to allow the elastomeric connector 510 to regain its original form or substantially its original form when the elastomeric connector 510 is not placed under the large load.

In the case that the plurality of conductive elements 630 comprise metal ball wires, the elastic effect is achieved when a load is placed onto the elastomeric connector 510 thereby causing the ball wires to come into conductive and elastic contact with each other. The ball wires when in contact form a substantially vertical conductive path (or in some embodiments, a lateral conductive path), as shown by way of example in FIG. 6B. Additionally, or alternatively, a vertical spring or elastic chain in which the adjacent ball wires forming the vertical conductive path and spring may be permitted to slide against each other in a horizontal direction (e.g., in a direction normal to a direction of a load) and in the vertical direction (albeit slightly) while maintaining continuous contact. In some embodiments, adjacent surfaces of the ball wires, when in contact, are permitted to slide against each other in the conductive and elastic path allows the conductive and elastic path to shift (while maintaining conductive and elastic contact) and form an are. The are formed by the ball wires while under a compressive load may have varying radii along the arc. Additionally, the arcs formed by horizontally adjacent vertical conductive and elastic paths may have similar or different arcs depending on an amount of load applied thereon.

The arc-shaped configuration of the ball wires when placed under a compressive load preferably allows for significant deformation (e.g., beyond some deformation threshold) of the elastomeric connector 510 while allowing the ball wires to maintain signal communication between the semiconductor 110 and the circuit board 520 and also, allow the ball wires to elastically resist variable shearing forces along the elastomeric connector 510 by allowing radii along the signal conductive path or conductive chain formed thereby to shift or change according to varying shearing forces applied to the various sections of the signal conductive path. That is, because the semiconductor 100 may expand or contract at a different rate than the circuit board 520, shearing forces experienced along top portion or region of the elastomeric connector 510 may be different than the shearing forces experienced along a bottom portion or region of the elastomeric connector 510. Accordingly, the resulting shearing forces experienced along the signal conductive path formed by the plurality of ball wires (e.g., the plurality of conductive elements) may also vary from a top region to a bottom region of the elastomeric connector 510.

Further yet, the plurality of conductive elements 630 while under compression and while maintaining conductive contact function to enable a shearing force absorption effect while maintaining signal conductivity between the semiconductor 100 and the circuit board 520. A shearing effect or shearing force against the elastomeric connector 510 may generally be caused by a disparity between the CTE of the circuit board 520 and the semiconductor 100. The semiconductor 100 being preferably made of silicon material typically may not vary greatly, in terms of expansion (expands approximately at 3 parts per million) or contraction, during heating or cooling. The circuit board 520, however, which may include materials such as copper may expand and contract at a different rate (e.g., 17 parts per million). Of course, because the semiconductor 100 is large the corresponding circuit board 520 is large so that a heating effect (when powered) applied to the assembly 500 may mainly causes the circuit board 520 to expand so greatly relative to the semiconductor 100 on the opposite side of the elastomeric connector 510 to cause to a large shearing force and resulting shearing effect on the connector 510.

However, as mentioned above, the configuration of the ball wires (e.g., roundness or substantial roundness) allows the balls to shift or slide against each other and thereby absorb and resist the shearing force caused due to the heating of the circuit board 520 and the semiconductor with mismatched CTEs.

2.3 Slidable Thermal Interface Material

Figure 7:
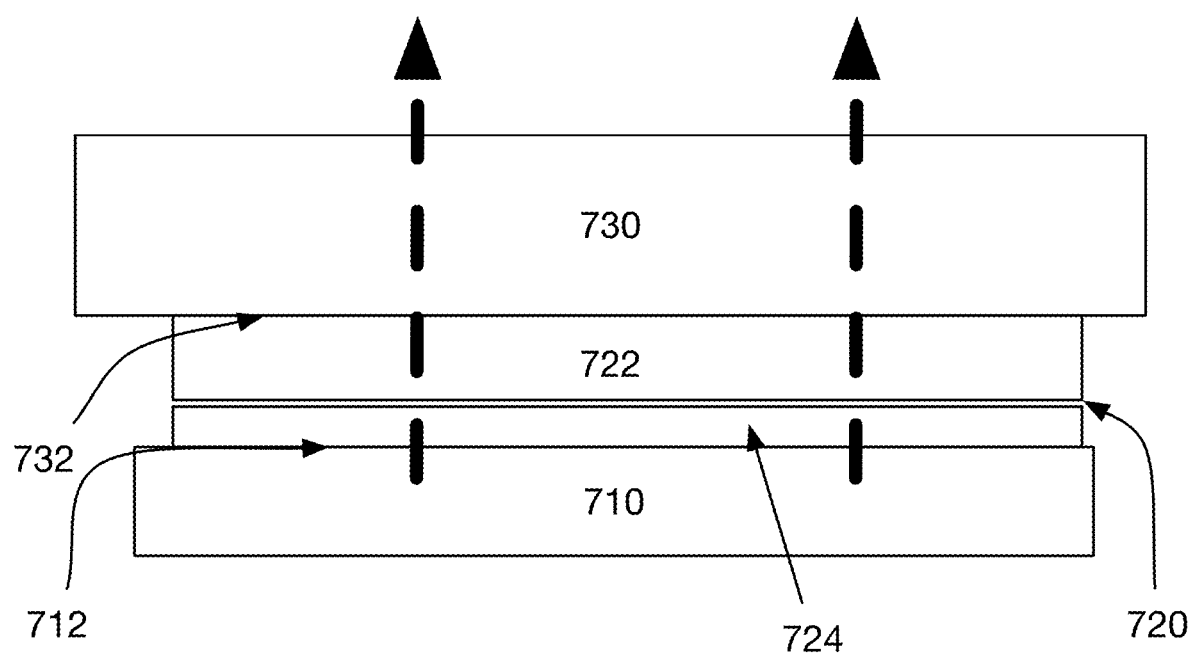
FIG. 7 illustrates a schematic of a section of an integrated circuit assembly in accordance with one or more embodiments of the present application.

As shown in FIG. 7, a schematic of a section of an integrated circuit assembly 700 that includes a substrate 710, a thermal interface 720, and a heat transfer element 730 is illustrated. In one preferred embodiment, the thermal interface 720 comprises a thermally conductive material 722 and a friction reduction material 724.

Preferably, the thermal interface 720 of the integrated circuit assembly 700 enables a sliding (ambulatory) thermal interface that enables a sliding between two components (e.g., a substrate and a heat transfer element) of the integrated circuit assembly. The thermal interface 720, when arranged between the substrate 710 and the heat transfer element 730, preferably enables a thermal flow of heat from the substrate 710 toward and/or into the heat transfer element 730 thereby causing a cooling of the substrate 710. The power that may be dissipated at the substrate 710 and that moves according to the thermal flow may cause expansions of the substrate 710, per se, as well as expansions of the heat transfer element 730 at different expansion rates. Typically, a coefficient of thermal expansion mismatch between the substrate 710 and the heat transfer element 730 would create shearing stresses at a traditional thermal interface that may cause damage to one or more of the substrate 710, the heat transfer element 730, and/or the traditional thermal interface. However, the thermal interface 720 of one or more embodiments of the present application provides at least one slippery and/or sliding surface in addition to a thermally conductive element that allows the substrate 710 and/or the heat transfer element 730 to expand, move, and/or contract at different rates during power dissipation and thermal flows and resultantly, cause a sliding at the thermal interface 720 based on the expansions, movements, and/or contractions of the substrate 710 and the heat transfer element 730. Accordingly, the sliding within and/or at the thermal interface 720 reduces a shearing stress and/or eliminates a shearing stress that would typically be applied against the substrate 710 and/or the heating transfer element 730 because of CTE mismatch.

The substrate 710 preferably includes a silicon semiconductor substrate (e.g., substrate 110), as described in U.S. patent application Ser. No. 16/019,882, which is incorporated herein in its entirety by this reference. It shall be noted that the substrate 710 may include any type or kind of a substrate, a heat generating component, a test component, or an element including, but not limited to, a semiconductor wafer, a panel, electronic circuit substrate, a printed circuit board, and/or the like. As mentioned, the substrate 710 preferably relates to large substrate and includes a plurality of die formed within the substrate 710. The circuitry and the large number of die formed within the substrate 710, when in use, may have a large power requirement and correspondingly, dissipate large amounts of power relative to traditional integrated circuits or chips with a single or a limited number of die.

The heat transfer element 730 preferably functions to transfer heat generated by a heat source, such as an electronic device (e.g., substrate 710) and/or a mechanical device to a cooling (fluid) medium where the heat may be dissipated away from the electronic device and/or mechanical device. In one preferred embodiment, the heat transfer element 730 comprises copper material, which has high thermal conductivity properties. It shall be noted that the heat transfer element 730 may include any suitable element or component having desirable thermal conductivity properties including, but not limited to aluminum, diamond, alloys, and/or the like.

The thermal interface 720 preferably functions to enable effective heat transfer and/or a thermal flow between a heat source and a heat dissipater (or heat exchanger) and additionally, functions to enable a relative movement (sliding) between the heat source and the heat dissipater. It shall be noted that the thermal interface 720 may be arranged between any two types or kinds of components and therefore, should not be limited to an arrangement between a heat source and a heat dissipater and/or limited to any arrangement described herein. Additionally, or alternatively, the thermal interface 720 may be arranged in any manner including in an arrangement in which one of a heat inflow and a heat outflow side of the thermal interface 720 is exposed to an atmosphere or open space and the other of the heat inflow and the heat outflow side of the thermal interface 720 is arranged on one of a heat source and a heat dissipater or the like.

In one preferred embodiment, the thermal interface 720 may be arranged between the substrate 710 and the heat transfer element 730. In such preferred embodiment, the thermal interface 720 may be defined by a thermally conductive material 722 and a friction reduction material 724. It shall be noted, however, that the thermal interface 720 may comprise a single element (e.g., a friction reduction material 724), in some embodiments, or may comprise a plurality of elements (in excess of two elements).

The thermally conductive material 722 of the thermal interface 720 preferably functions to enable a thermal flow thereby carrying heat from a first area to a second area, preferably away from a heat source (e.g., the substrate 710). In some embodiments, when arranged between the substrate 710 and the heat transfer element 730, the thermally conductive material 722 enables a thermal flow (heat flow) away of the substrate 710 into the heat transfer element 730. It shall be noted that a thermal flow in an opposite direction may also be achieved (e.g., from the heat transfer element to the substrate).

Preferably, the thermally conductive material 722 includes a material having a higher thermal conductivity (k) value than an air gap. The thermal conductivity (k) value of the thermally conductive material 722 preferably satisfies or is above a minimum thermal conductivity threshold that ensures that heat may be carried by the thermally conductive material 722 from a first area (e.g., an area having a heat source) to a second area (e.g., an area having a heat dissipater), efficiently. In a preferred embodiment, the thermal conductivity value of the thermally conductive material 722 is greater than a thermal conductivity value of the friction reduction material 724, Additionally, or alternatively, the thermally conductive material 722 may include a material that is compliant with a coefficient of thermal expansion (CTE) of either of a material of the heat source (e.g., the substrate 710) and a material of the heat dissipater (e.g., heat transfer element 730). That is, in one or more embodiments, a CTE of the thermally conductive material 722 should enable an expansion and/or a contraction of either the material of the heat source or the material of the heat dissipater (whichever the thermally conductive material 722 is applied on). In such embodiments, a shear strength of the thermally conductive material 722 is preferably above or substantially matches a shear strength of a material to which it is adhered to or, at a minimum, the shear strength of the thermally conductive material 722 preferably does not fall below a minimum shear strength threshold. In this way, an expansion (or non-expansion) or a contraction (or non-contraction) of the thermally conductive material 722 preferably caused by the heat source of the heat transfer element does not damage a material of the thermally conductive material 722. An opposite configuration may also be achieved in which the shear strength of the thermally conductive material 722 may not exceed a maximum shear strength threshold so that a shear strength of the thermally conductive material 722 does not damage a material of the heat transfer element or of a material of the heat source. Thus, in a preferred embodiment, a shear strength of the thermally conductive material 722 may be equal to or above a shear strength of a material to which it is adhered and below a maximum shear strength threshold.

Additionally, or alternatively, the thermally conductive material 722 may be a conforming material, such that when the thermally conductive material 722 is applied onto a surface of a heat source or a heat dissipater, the thermally conductive material 722 mates with the surface to reduce and/or eliminate air gaps along the mating interface. That is, the thermally conductive material 722 may function to mate with a roughness of a surface of either a heat source or a heat transfer element, such that the thermally conductive material 722 fills into cavities formed by the roughness of the surface and displaces air when the thermally conductive material 722 is applied.

In a preferred embodiment, the thermally conductive material 722 includes indium, but may additionally, or alternatively, include any suitable thermally conductive material having a high thermally conductivity value relative to one or more of a heat source and a heat dissipater. For instance, the thermally conductive materially 722 may additionally include, but should not be limited to, thermal grease, thermal adhesives, thermal gap fillers, thermally conductive pads or sheets, thermal tape, phase-change materials, any combination thereof and/or the like.

The friction reduction material 724 of the thermal interface 720 preferably functions to enable a relative movement (or a sliding) between a heat source and a heat dissipater. In one or more embodiments, when the friction reduction material 724 is arranged between the substrate 710 and the heat transfer element 730, the friction reduction material 724 preferably provides a sliding surface or interface that enables a (thermally conductive material 722) material or component of the substrate 710 or the heat transfer element 730 to easily slide across the sliding surface due to a low friction coefficient of the sliding surface of the friction reduction material 724. That is, in a preferred embodiment, the friction reduction material 724 and the thermally conductive element 722 are arranged in slidable communication and/or are slidably connected, and in particular, when an integrated assembly including such thermal interface 720 is in a compressed stated such that the thermally conductive element 722 and the friction reduction material 724 are in contact or physical communication.

Preferably, the friction reduction material 724 includes a material having a lower coefficient of friction value than an opposing surface. The coefficient of friction value of the friction reduction material is preferably at or below a maximum coefficient of friction threshold that ensures that an opposing surface that is in contact with a sliding surface of friction reduction material 724 can move or slide along the surface even when a great amount of pressure and/or force presses together the sliding surface of the friction reduction material 724 and the opposing surface. That is, in some embodiments, the coefficient of friction of the friction reduction material 724 is sufficiently low to enable a relative movement or a sliding at the thermal interface when a movement (e.g., thermal expansion or contraction) between integrated circuit components is caused by CTE mismatch.

Preferably, the friction reduction material comprises a thin and/or hard material with a low surface roughness to enable sliding thereon. In one preferred embodiment, the friction reduction material comprises polytetrafluoroethylene (PTFE) having a thickness that is preferably three hundred (300) nanometers or less (and, nominally 250 nanometers). It shall be noted, however, that the friction reduction material 724 may include any suitable material having a coefficient of friction that is sufficiently low to enable a sliding surface and may include, but should not be limited to, aluminum magnesium boride (BAM), diamond-like carbon, and/or the like. Additionally, while it may be preferred that a thickness of the thermally conductive material 724, when implemented with PTFE, be 300 nanometers or less, a thickness of the thermally conductive material may exceed 300 nanometers and can include any range or subset of values between zero and 300 nanometers and any reasonable subset of thickness values above 200 nanometers so long as a sliding surface may be achieved and a thermal resistance is maintained at or below a thermal resistance threshold and/or a thermal conductivity value of the thermally conductive material 724 satisfies or exceeds a minimum thermal conductivity value.

In a first preferred implementation, the integrated circuit assembly may include a thermally conductive material 722 of the thermal interface 720 that may be applied to a mating surface 732 of the heat transfer element 730 and the friction reduction material 724 of the thermal interface 720 may be applied to a mating surface 712 of the substrate 710.

In this first implementation, the thermally conductive material 722 preferably comprises an indium material and the heat transfer element 730 comprises a heatsink having a copper composition (or any suitable heat transfer element, including aluminum or the like). Additionally, the friction reduction material 724, in this implementation, preferably comprises polytetrafluoroethylene (PTFE) (or any suitable low coefficient of friction material) and the substrate 710 preferably comprises a semiconductor substrate (e.g., a wafer or the like).

As mentioned, in the first implementation, the PTFE may be applied to a mating surface 712 of the semiconductor substrate. The friction reduction material 724 comprising PTFE or the like may be applied to the surface of the semiconductor substrate in any suitable manner including, as single, continuous form along an entire surface or a subsection of a surface of the semiconductor substrate. Alternatively, the PTFE may be applied intermittently and in a discontinuous form (with gaps) along a surface of the semiconductor substrate.

As mentioned, in the first implementation, the indium may be applied to a mating surface 732 of the copper heatsink. Preferably, the indium may be applied to fully conform to a roughness of a surface of the copper heatsink thereby eliminating or substantially reducing air gaps between the indium and the mating surface of the copper heatsink.

Additionally, in this first implementation, the integrated assembly 700 may be configured such that the side or surface of the copper heatsink having the indium and the side or surface of the semiconductor substrate are opposing surfaces. Accordingly, when the copper heatsink and the semiconductor substrate are pressed together, the indium and the PTFE come into contact thereby forming the thermal interface 720.

In a variant of the first implementation, the thermal interface 720 may be rearranged, such that the thermally conductive material 722 may be arranged along a surface of the substrate 710 and the friction reduction material 724 may be arranged along a surface of the heat transfer element 730. As an example, a coating of the PTFE material may be disposed along a surface of a copper heatsink and the indium may be disposed along a surface of the silicon semiconductor substrate. While such an arrangement may be achieved in accordance with the one or more embodiments of the present application, additional considerations should be considered to enable an effective thermal interface 720 with this arrangement. For instance, the CTE mismatch between the indium and the silicon semiconductor substrate may limit a manner in which the indium is applied to a surface of the silicon semiconductor substrate.

In a second implementation, thermal interface 720 may only include a friction reduction material 724, such as PTFE. In this second implementation, the friction reduction material 724 may be applied to either a surface of substrate 710 or the heat transfer element 730, but preferably on the surface of the substrate 710. In such implementation, additional smoothing and/or polishing of either the substrate 710 and/or the heat transfer element 730 may be required to achieve a workable sliding surface at the thermal interface 720.

In a variant of the second implementation, the thermal interface 720 may include only a friction reduction material 724, such as PTFE, that is applied to both a surface of substrate 710 and the heat transfer element 730. In such second implementation, the sliding and/or ambulatory surface of the thermal interface 720 includes only or primarily PTFE or a similar friction reduction material.

In a third implementation, the thermal interface 720 may include a plurality of layers of a thermally conductive material 722 and a plurality of layers of a friction reduction material 724. Preferably, the thermal conductive material 722 and the friction reduction material 724 may be arranged in an alternating manner to form a thermal interface 720. In one example, the thermal interface may be arranged in the following manner: thermal conductive material (e.g., indium), friction reduction material (e.g., PTFE), thermal conductive material, friction reduction material, and/or the like. In such example, one layer of a thermal conductive material may be preferably applied onto the heat transfer element 730 and one layer of a friction reduction material may be applied to one layer of the semiconductor substrate 710. It shall be noted that the plurality of layers of a thermally conductive material 722 and the plurality of layers of a friction reduction material 724 may be arranged in any suitable manner and should not be limited to the examples described herein.

In a fourth implementation, the thermal interface 720 comprises a composite that combines a thermally conductive material 722 together with a friction reduction material 724. In such embodiments, the composite may include any suitable mixture of the thermally conductive material 722 and the friction reduction material 724 to enable an effective thermal flow as well as a sliding thermal interface.

3. Method of Implementing a Sliding Thermal Interface within an IC Assembly

Figure 8:
FIG. 8 illustrates a method 800 in accordance with one or more embodiments of the present application.
Figure 9:
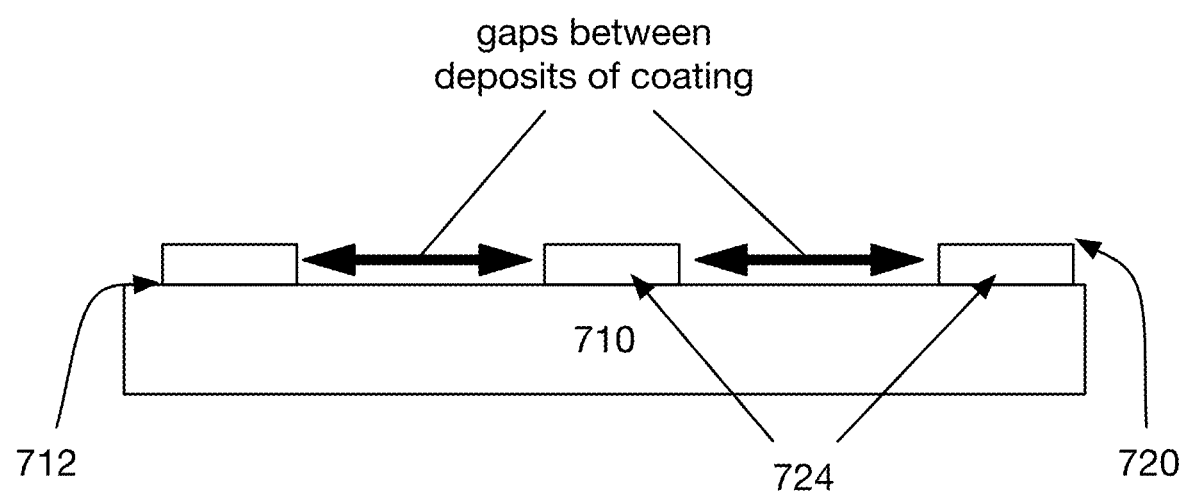
FIG. 9 illustrates a schematic of an example of a section of an integrated circuit in accordance with one or more embodiments of the present application.

As shown in FIG. 8, a method 800 for implementing a sliding thermal interface within an integrated circuit assembly includes applying a first thermal interface component to a first surface of the integrated circuit assembly S810, applying a second thermal interface component to a second surface of the integrated circuit assembly S820, and defining a sliding thermal interface using the first and the second interface components S830.

S810, which includes applying a first thermal interface component to a first surface of the integrated circuit assembly, functions to identify a first thermal interface component, such as a thermally conductive material or a friction reduction material and apply the identified first thermal interface component to a first surface of an integrated circuit assembly. The first thermal interface component may be identified and/or selected from either a plurality (or group) of thermally conductive materials or a plurality (or group) of friction reduction materials.

In a preferred embodiment, S810 may function to select a first thermal interface component comprising a thermally conductive material, such as indium, for example. In such preferred embodiment, S810 may function to mate the thermally conductive material to a first surface of a component of the integrated circuit assembly using any suitable mating technique or application technique. As an example, S810 may function to mate a thermally conductive material, such as indium, to a mating surface of a heatsink component, such as copper, using a vapor deposition technique. It shall be noted that any suitable mating technique or combination of mating techniques may be used to achieve a bond between the thermally conductive material and the first surface including, but not limited to, pressure applications, heat applications (soldering or melting), plasma enhanced vapor deposition, spray deposition, sputtering, soldering, and/or the like.

S815, which optionally includes adding a mating layer, may function to provide a mating layer between the thermally conductive material and the first surface of the component (e.g., the copper heatsink) of the integrated circuit assembly that enables the thermally conductive material to better conform at the mating surface. For instance, S815 may function to apply a mating layer comprising nickel along a surface of a copper heatsink prior to applying a layer of indium. Once the nickel layer is in place, S815 may function to applying a layer of indium onto the layer of nickel.

S820, which includes applying a second thermal interface component to a second surface of the integrated circuit assembly, functions to identify a second thermal interface component, such as a friction reduction material, and apply the identified second thermal interface component to a second surface of an integrated circuit assembly. The second thermal interface component may be identified and/or selected from either a plurality (or group) of friction reduction materials.

In a preferred embodiment, S820 may function to select a first thermal interface component comprising a friction reduction material, such as PTFE, for example. In such preferred embodiment, S820 may function to mate the friction reduction material to a second surface of a component of the integrated circuit assembly using any suitable mating technique or application technique. As an example, S820 may function to mate a friction reduction material, such as PTFE, to a mating surface of a substrate, such as a silicon semiconductor substrate, using a vapor deposition technique. It shall be noted that any suitable mating technique or combination of mating techniques may be used to achieve a bond between the friction reduction material and the second surface including, but not limited to, soldering, pressure applications, heat applications (soldering or melting), spray deposition, and/or the like.

S830, which includes defining a sliding thermal interface using the first and the second thermal interface components, functions to arrange together the thermally conductive material (as applied to component of the IC assembly) and the friction reduction material (as applied to a different component of the IC assembly), such that the surfaces thereof come into contact. In one example, the first thermal interface component comprises indium and the second thermal interface component comprises PTFE. In such example, an expose surface of the indium and an exposed surface of the PTFE may be pressed together to form a slidable thermal interface on which the indium is capable of sliding over the low friction surface of the PTFE.

Optionally, S835, which includes enhancing the sliding thermal interface, may function to additionally perform one or more mechanical, chemical (etching), and/or mechanical-chemical smoothing operations to at least the thermally conductive material disposed at the first surface of the component of the integrated circuit assembly prior to creating the contact between the thermally conductive material and the friction reduction material. To reduce an opportunity for a creation of indium-oxide or the like, S835 preferably smoothes out a contact surface of an indium or similar thermally conductive material. In such case, when a contact is made between the thermally conductive material and the friction reduction material, there is a limited amount to no air gaps within the sliding region of the thermal interface.

Additionally, or alternatively, S835 may function to mate the thermally conductive material and the friction reduction material in a low-oxide environment to mitigate oxidation of the thermally conductive material at the sliding thermal interface.

It shall be understood that the method 800 is an exemplary method that may be implemented in any suitable order to achieve the inventions and/or embodiments of the inventions within the purview or that may be easily contemplated in view of the disclosure provided herein. For instance, S810-S820 of method 800 may be performed in any order without departing for the scope of the inventions described herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. An integrated circuit assembly comprising:
a semiconductor substrate;
a die lithographically formed along a first broad surface of the semiconductor substrate;
a heat transfer element; and
an ambulatory thermal interface arranged between the semiconductor substrate and the heat transfer element, the ambulatory thermal interface comprising:
(i) a thermally conductive material bonded to a surface of the heat transfer element, and
(ii) a solid friction reduction material bonded to a second broad surface of the semiconductor substrate opposing the first broad surface,
wherein
opposing surfaces of the thermally conductive material and the solid friction reduction material define a slidable interface when placed in contact.

2. The integrated circuit assembly according to claim 1, wherein:
a first surface of the thermally conductive material is mated with the surface of the heat transfer element,
a first surface of the solid friction reduction material is mated with the second broad surface of the semiconductor substrate,
a second surface of the thermally conductive material that is opposite the first surface of the thermally conductive material defines a free surface of the thermally conductive material,
a second surface of the solid friction reduction material that is opposite the first surface of the solid friction reduction material defines a free surface of the solid friction reduction material, and
the free surface of the thermally conductive material and the free surface of the solid friction reduction material define the slidable interface.

3. The integrated circuit assembly according to claim 1, wherein:
the thermally conductive material comprises an indium-based material, and
the solid friction reduction material comprises a polytetrafluoroethylene-based material.

4. The integrated circuit assembly according to claim 1, wherein
a shear yield strength of the thermally conductive material is equal to or above a shear yield strength of the heat transfer element and below a threshold value of the shear yield strength.

5. The integrated circuit assembly according to claim 1, further comprising:
a mating layer that is interposed between the thermally conductive material and the surface of the heat transfer element,
wherein the mating layer comprising a material distinct from the thermally conductive material.

6. The integrated circuit assembly according to claim 1, wherein
the solid friction reduction material comprises polytetrafluoroethylene having a thickness that is three hundred nanometers or less.

7. The integrated circuit assembly according to claim 1, wherein
a thermal conductivity (k) value of the thermally conductive material is greater than a thermally conductivity value of an air gap.

8. The integrated circuit assembly according to claim 1, wherein
a coating of the solid friction reduction material is disposed continuously along the second broad surface of the semiconductor substrate.

9. The integrated circuit assembly according to claim 1, wherein
a coating of the solid friction reduction material is disposed discontinuously along the second broad surface of the semiconductor substrate thereby forming gaps between deposits of the coating.

10. The integrated circuit assembly according to claim 1, wherein
the solid friction reduction material includes a material having a lower coefficient of friction value than an opposing surface of the thermally conductive material.

11. The integrated circuit assembly according to claim 1, wherein
the solid friction reduction material comprises one of aluminum magnesium boride and diamond-like carbon.

12. The integrated circuit assembly according to claim 1, wherein
the thermally conductive material comprises one of thermal grease, thermal adhesives, thermal gap fillers, thermally conductive pads or sheets, and thermal tape.

13. An integrated circuit assembly comprising:
a heat source comprising: a semiconductor body and a die lithographically formed with the semiconductor body;
a heat dissipater;
a printed circuit board (PCB) substrate, the heat source arranged between the PCB substrate and the heat dissipater;
a compliant layer compressed between the PCB substrate and the heat source;
a sliding thermal interface interposed between the heat source and the heat dissipater, the sliding thermal interface comprising:
(i) a thermally conductive material arranged along a surface of the heat dissipater;
(ii) a friction reduction material is-arranged along a surface of the heat source;
(iii) opposing surfaces of the thermally conductive material and the friction reduction material define a slippery interface that enables a relative movement between the thermal conductive material and the friction reduction material when in contact, wherein the thermally conductive material elastically deforms when in contact with the friction reduction material based on a compressive loading of the compliant layer.

14. The integrated circuit assembly according to claim 13, wherein
the thermally conductive material and the friction reduction material slide at the slippery interface based on an expansion or a contraction of one or more of the heat source and the heat dissipater.

15. The integrated circuit assembly according to claim 13, wherein
the thermally conductive material comprises indium-based material, and
the friction reduction material comprises a polytetrafluoroethylene-based material.

16. An integrated circuit assembly comprising:
- a wafer-scale semiconductor substrate;
- a plurality of die lithographically formed along a first broad surface of the wafer-scale semiconductor substrate;
- a circuitry layer, formed along the first broad surface of the wafer-scale semiconductor substrate, comprising a plurality of inter-die connections that communicatively connect die of the plurality of die;
- a circuit board;
- a compliant connector arranged along the first broad surface of the wafer-scale semiconductor substrate and communicatively connecting the circuit board to each of the plurality of die;
- a heat transfer element; and
- an ambulatory thermal interface arranged between the wafer-scale semiconductor substrate and the heat transfer element, the ambulatory thermal interface comprising:
  - (i) a solid friction reduction material, wherein:
  - (a) a first surface of the solid friction reduction material opposes a surface of the heat transfer element,
  - (b) a second surface of the solid friction reduction material is arranged along a second broad surface of the wafer-scale semiconductor substrate opposing the first broad surface,
  - (c) the first surface of the solid friction reduction material and the surface of the heat transfer element define a slidable interface when placed in contact.

17. The integrated circuit assembly according to claim 16, wherein
  the solid friction reduction material includes a material having a lower coefficient of friction value than the surface of the heat transfer element.

18. The integrated circuit assembly according to claim 16, wherein
  a coating of the solid friction reduction material is disposed continuously along the second broad surface of the wafer-scale semiconductor substrate.

* * * * *